(12) United States Patent
Narayanan et al.

(10) Patent No.: US 9,330,785 B1
(45) Date of Patent: May 3, 2016

(54) READ OPERATION BASED AGING SENSOR FOR STATIC RANDOM ACCESS MEMORY (SRAM)

(71) Applicant: QUALCOMM Incorporated, San Diego, CA (US)

(72) Inventors: Venkatasubramanian Narayanan, San Diego, CA (US); Keith Alan Bowman, Morrisville, NC (US); Alex Dongkyu Park, San Diego, CA (US); Francois Ibrahim Atallah, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/698,844

(22) Filed: Apr. 29, 2015

(51) Int. Cl.
*G11C 11/00* (2006.01)
*G11C 29/12* (2006.01)
*G11C 11/419* (2006.01)

(52) U.S. Cl.
CPC .............. *G11C 29/12* (2013.01); *G11C 11/419* (2013.01)

(58) Field of Classification Search
CPC .... G11C 11/412; G11C 11/413; G11C 29/50; G11C 11/401
USPC .................................................. 365/154, 201
See application file for complete search history.

(56) References Cited

U.S. PATENT DOCUMENTS

| | | | | |
|---|---|---|---|---|
| 5,025,422 A | * | 6/1991 | Moriwaki | ............. G11C 7/062 365/189.11 |
| 7,225,375 B2 | | 5/2007 | Cochran et al. | |
| 8,705,268 B2 | | 4/2014 | Buer et al. | |
| 8,729,908 B2 | | 5/2014 | Cranford, Jr. et al. | |

OTHER PUBLICATIONS

Ahmed F, et al., "NBTI Resistant SRAM Design," 4th IEEE International Workshop on Advances in Sensors and Interfaces (IWASI), Jun. 2011, pp. 82-87.
Ceratti A., et al., "Investigating the Use of an On-Chip Sensor to Monitor NBTI Effect in SRAM," IEEE 13th Latin American Test Workshop (LATW), Apr. 2012, pp. 1-6.

\* cited by examiner

*Primary Examiner* — Huan Hoang
(74) *Attorney, Agent, or Firm* — Muncy, Geissler, Olds & Lowe, P.C.

(57) ABSTRACT

In a static random access memory (SRAM), such as an SRAM cache in a processor or system-on-a-chip (SoC) device, an aging sensor is provided for testing degradation of SRAM cells comprising p-channel metal oxide semiconductor (PMOS) transistors. The minimum power supply voltage $V_{DDMIN}$ for the SRAM may be dynamically scaled up as the SRAM ages by performing read tests with and without the wordline overdrive voltage $V_{WLOD}$.

30 Claims, 6 Drawing Sheets

READ OPERATION BASED AGING SENSOR FOR STATIC RANDOM ACCESS MEMORY (SRAM)

FIELD OF DISCLOSURE

Various embodiments described herein relate to static random access memory (SRAM), and more particularly, to aging sensor for SRAM.

BACKGROUND

In processors or other integrated circuit devices, such as system-on-a-chip (SoC) devices, static random access memory (SRAM) caches may be provided to store or retain data. In a typical SRAM cache, the bitcells may be subjected to aging stress that leads to a degradation of the read minimum power supply voltage $V_{DDMIN}$ over time. Such degradation may be factored in at the time of designing the device as a flat negative bias temperature instability (NBTI) voltage margin. Aging of the SRAM cache may be an important consideration in the design of processors and other integrated circuit devices due to aging stress of retained data. A typical bitcell in a typical SRAM cache may include one or more p-channel metal oxide semiconductor (PMOS) transistors and one or more n-channel metal oxide semiconductor (NMOS) transistors. In any given state of retention, at least one of the PMOS transistors in the bitcell may be subjected to the aging stress.

In designing integrated circuit devices with SRAM caches, foundries may typically set a very large NBTI voltage margin by assuming the worst case stress conditions throughout the lifetime of the devices and by assuming that there is no recovery from retention failure. In other words, foundries may typically set a very conservative flat guard band for $V_{DDMIN}$, which is the minimum power supply voltage at which an SRAM bitcell can be reliably read from or written to at a given time. In typical SRAM caches, the minimum power supply voltage $V_{DDMIN}$ may increase over time, for example, over a span of several years, due to aging in the SRAM transistors. Attempts have been made to alleviate the need for overly pessimistic flat guard bands in the design of integrated circuit devices. It would be desirable to devise an aging sensor and a method to measure the aging of an SRAM cache without occupying a large circuit area of the SRAM cache.

SUMMARY

Exemplary embodiments of the disclosure are directed to apparatus and methods for monitoring of static random access memory (SRAM) by an aging sensor.

In an embodiment, an SRAM is provided, the SRAM comprising: a plurality of arrays of active SRAM cells to store data; and an aging sensor comprising an array of sensor SRAM cells configured to dynamically monitor aging of the arrays of active SRAM cells by using an adjustable wordline overdrive voltage ($V_{WLOD}$) in the array of sensor SRAM cells, the array of sensor SRAM cells having a minimum power supply voltage ($V_{DDMIN}$) that is greater than or equal to a $V_{DDMIN}$ for the arrays of active SRAM cells.

In another embodiment, a method of searching for a minimum power supply voltage $V_{DDMIN}$ for a static random access memory (SRAM) comprising a plurality of SRAM cells, each of the SRAM cells comprising a plurality of metal oxide semiconductor (MOS) transistors including at least one p-channel MOS (PMOS) transistor, the method comprising: (a) setting an initial power supply voltage ($V_{DD}$) to a specified minimum power supply voltage ($V_{DDMIN(SPEC)}$); (b) writing ones to all of the SRAM cells; (c) performing a first read test of the SRAM cells; (d) determining whether the first read test passes; (e) if the first read test passes, performing at least one additional read test of the SRAM cells; and (f) if said at least one additional read test passes, decreasing $V_{DD}$ by a predetermined amount ($\Delta V$).

In another embodiment, a method of calibrating an aging sensor in a static random access memory (SRAM) comprising a plurality of active SRAM cells, each of the SRAM cells comprising a plurality of metal oxide semiconductor (MOS) transistors including at least one p-channel MOS (PMOS) transistor, the method comprising: (a) setting an initial power supply voltage ($V_{DD}$) for the aging sensor to a minimum power supply voltage $V_{DDMIN(ARRAY)}$ for the active SRAM cells; (b) writing ones to all of the SRAM cells in the aging sensor; (c) performing a first read test of the SRAM cells in the aging sensor with only $V_{DD}$; (d) determining whether the first read test of the SRAM cells in the aging sensor with only $V_{DD}$ passes; (e) if the first read test of the SRAM cells in the aging sensor with only $V_{DD}$ passes, performing a second read test of the SRAM cells in the aging sensor with only $V_{DD}$; (f) if the second read test of the SRAM cells in the aging sensor with only $V_{DD}$ passes, performing a third read test of the SRAM cells in the aging sensor with $V_{DD}$ plus a wordline overdrive voltage ($V_{WLOD}$); (g) if the third read test of the SRAM cells in the aging sensor with $V_{DD}$ plus $V_{WLOD}$ passes, performing a fourth read test of the SRAM cells in the aging sensor with $V_{DD}$ plus $V_{WLOD}$; and (h) if the fourth read test of the SRAM cells in the aging sensor with $V_{DD}$ plus $V_{WLOD}$ passes, increasing $V_{WLOD}$ by a predetermined amount ($\Delta V$).

In yet another embodiment, a method of operating a static random access memory (SRAM) comprising a plurality of arrays of active SRAM cells to store data and an aging sensor comprising an array of sensor SRAM cells, the method comprising: (a) issuing a read command to the aging sensor; (b) reading, by the aging sensor, values stored in the array of sensor SRAM cells with a programmed wordline overdrive voltage ($V_{WLOD}$); (c) determining whether the values read by the aging sensor are correct; and (d) if the values read by the aging sensor are incorrect, increasing a power supply voltage ($V_{DD}$) for the arrays of active SRAM cells.

BRIEF DESCRIPTION OF THE DRAWINGS

The accompanying drawings are presented to aid in the description of embodiments of the disclosure and are provided solely for illustration of the embodiments and not limitations thereof.

DETAILED DESCRIPTION

Figure 1:
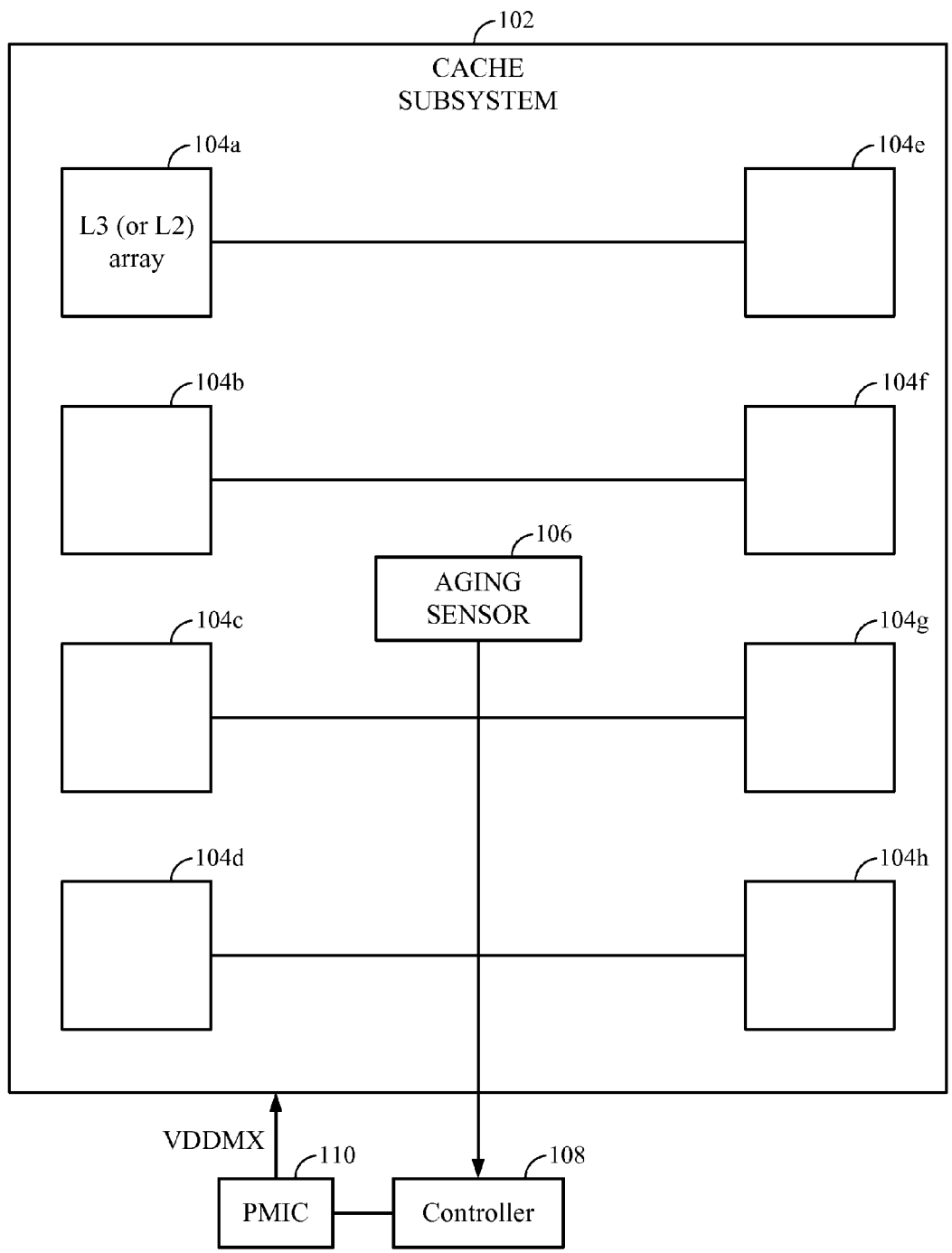
FIG. 1 is a simplified block diagram of an embodiment of a static random access memory (SRAM) cache subsystem in an integrated circuit device.

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

In order to provide accurate monitoring of the aging of an active static random access memory (SRAM) bitcells in a memory system or subsystem, it is desirable to use an aging sensor or monitor that also uses the same type of bitcells that are used in the subsystem. In designing a memory system or subsystem with an integrated aging sensor, it is desirable that the aging sensor consume as little area, leakage and active power overhead as possible. Towards this end, considerations may be taken into account in the design of a memory system or subsystem to produce a layout such that the aging sensor has a much smaller density of SRAM bitcells for use as a monitor compared to the actual active SRAM arrays for storing data.

The minimum power supply voltage ($V_{DDMIN}$) of an SRAM array is a statistical quantity that is dependent on both the amount of local variation inherent in the bitcells, as well as the total density of the array. As the density of the memory system or subsystem increases, so does the effective $V_{DDMIN}$ of the system or subsystem. This is because, for a given amount of local variation per SRAM bitcell, the probability of a single bitcell failing in a larger system or subsystem is higher compared to a smaller system or subsystem. In statistical terms, it is typically the case that the required standard deviation coverage (sigma-coverage or σ-coverage) is higher for a larger system or subsystem as compared to a smaller system or subsystem. For example, we can assume that a single bitcell has a $V_{DDMIN}$ distribution that is centered around a mean μ and a sigma σ, with $V_{DDMIN}$ being defined as the point at which the bitcell has only a 5% probability of failing, that is, in other words, a yield of 95%. In a typical example, the desired yield coverage for a 64 Megabits (Mb) of bitcells may require that the minimum $V_{DDMIN}$ be at least 6.04σ higher than this mean value, which corresponds to the probability that at least one bitcell has a 5% or higher probability of failing at this voltage. On the other hand, if the density of the bitcells is only 256 Kb, this required coverage decreases to only 5.07σ higher than the mean value. Thus intrinsically, a smaller density aging sensor typically has a lower $V_{DDMIN}$ compared to the larger density array of bitcells that it is required to monitor.

Because the $V_{DDMIN}$ of a smaller sized aging sensor is intrinsically lower than that of a larger array that is required to monitor or track, it would be desirable that the aging sensor have at least the same $V_{DDMIN}$ as the array being monitored or tracked or slightly greater $V_{DDMIN}$ than the array being monitored or tracked. In order to achieve this, a wordline overdrive voltage ($V_{WLOD}$) is used as a tunable option in an embodiment. When a read operation is performed with $V_{WLOD}$, the resultant $V_{DDMIN}$ of the array is higher than a read operation without using $V_{WLOD}$, because the p-channel metal oxide semiconductor (PMOS) device that holds a bit value of "1" on the side opposite to the node that is being read in the array is weakened, when the voltage of the node that is being read bounces to a higher level. Thus, by selectively using $V_{WLOD}$ only for the aging sensor, the $V_{DDMIN}$ of the aging sensor will be at least the same as and usually higher than what is required only due to local variations of the bitcells. Therefore, it is desirable to tune the $V_{WLOD}$ such that the aging sensor has the same or higher $V_{DDMIN}$ compared to the active memory array being tracked.

FIG. 1 is a simplified block diagram of an embodiment of a static random access memory (SRAM) cache subsystem in an integrated circuit device, for example, a processor device or a system-on-a-chip device. In the embodiment shown in FIG. 1, the SRAM cache subsystem 102 includes a plurality of arrays of active SRAM cells 104a, 104b, 104c, . . . 104h. Each array of SRAM cells, for example, the SRAM array 104a, may be implemented on one or more layers, such as L3 or L2 layer, for example, of a multilayer or three-dimensional integrated circuit device. In the embodiment shown in FIG. 1, the SRAM cache subsystem 102 also includes an aging sensor 106, which may comprise a small array of SRAM cells identical to the SRAM cells in any of the arrays 104a, 104b, 104c, . . . 104h, except that the SRAM cells in the aging sensor 106 are dedicated to monitoring or testing the aging of SRAM cells including active SRAM cells in the arrays 104a, 104b, 104c, . . . 104h for storing or retaining data in the SRAM cache subsystem 102. An example of an SRAM cell will be described in further detail with respect to the circuit diagram of FIG. 2. In the embodiment illustrated in FIG. 1, a controller 108 is coupled to the aging sensor 106 to control the power supply voltage $V_{DD}$ to the SRAM cells in the arrays 104a, 104b, 104c, . . . 104h based on an output from the aging sensor 106. In a further embodiment, a power management integrated circuit (PMIC) 110 is coupled to the controller 108 to generate the $V_{DD}$ based on the output from the aging sensor 106.

In an embodiment, the arrays 104a, 104b, 104c, . . . 104h of active SRAM cells for storing or retaining data may be configured to search for a minimum power supply voltage $V_{DDMIN}$ for the active SRAM cells. In an embodiment, the aging sensor 106 may be configured to calibrate a wordline overdrive voltage $V_{WLOD}$ in the array of SRAM cells in the aging sensor using the minimum power supply voltage $V_{DDMIN}$ for the active SRAM cells. In a further embodiment, the aging sensor 106 may also be configured to execute a test sequence to set a power supply voltage $V_{DD}$ for the arrays of active SRAM cells. In an embodiment, the arrays 104a, 104b, 104c, . . . 104h of active SRAM cells may be configured to search for $V_{DDMIN}$ for the active SRAM cells by performing one or more read operations on the arrays of active SRAM cells in one or more built-in self-test (BIST) operations. An embodiment of performing one or more read operations on the arrays 104a, 104b, 104c, . . . 104h of active SRAM cells to search for $V_{DDMIN}$ will be described in further detail below with respect to FIG. 3.

In an embodiment, the aging sensor 106 is configured to perform test operations which include a calibration operation by performing one or more read operations on the array of SRAM cells in the aging sensor 106 by using only $V_{DD}$ and performing one or more additional read operations on the array of SRAM cells in the aging sensor by using $V_{DD}$+ $V_{WLOD}$. An embodiment of performing one or more read operations on the array of SRAM cells in the aging sensor 106 by using only $V_{DD}$ and performing one or more additional read operations on the array of SRAM cells in the aging sensor 106 by using $V_{DD}$+$V_{WLOD}$ will be described in further detail below with respect to FIG. 4. In a further embodiment, the test operations performed by the aging sensor 106 also include a test operation to set the $V_{DD}$ by stressing the aging sensor 106 at an increased $V_{DD}$ and an increased temperature, lowering $V_{DD}$ to $V_{DDMIN}$, performing one or more read operations on the array of SRAM cells in the aging sensor 106 by using only $V_{DD}$, and performing one or more read operations on the array of SRAM cells in the aging sensor 106 by using $V_{DD}$+$V_{WLOD}$. An embodiment of performing the test operation to generate the $V_{DD}$ based on $V_{WLOD}$ will be described in further detail below with respect to FIG. 5.

Figure 2:
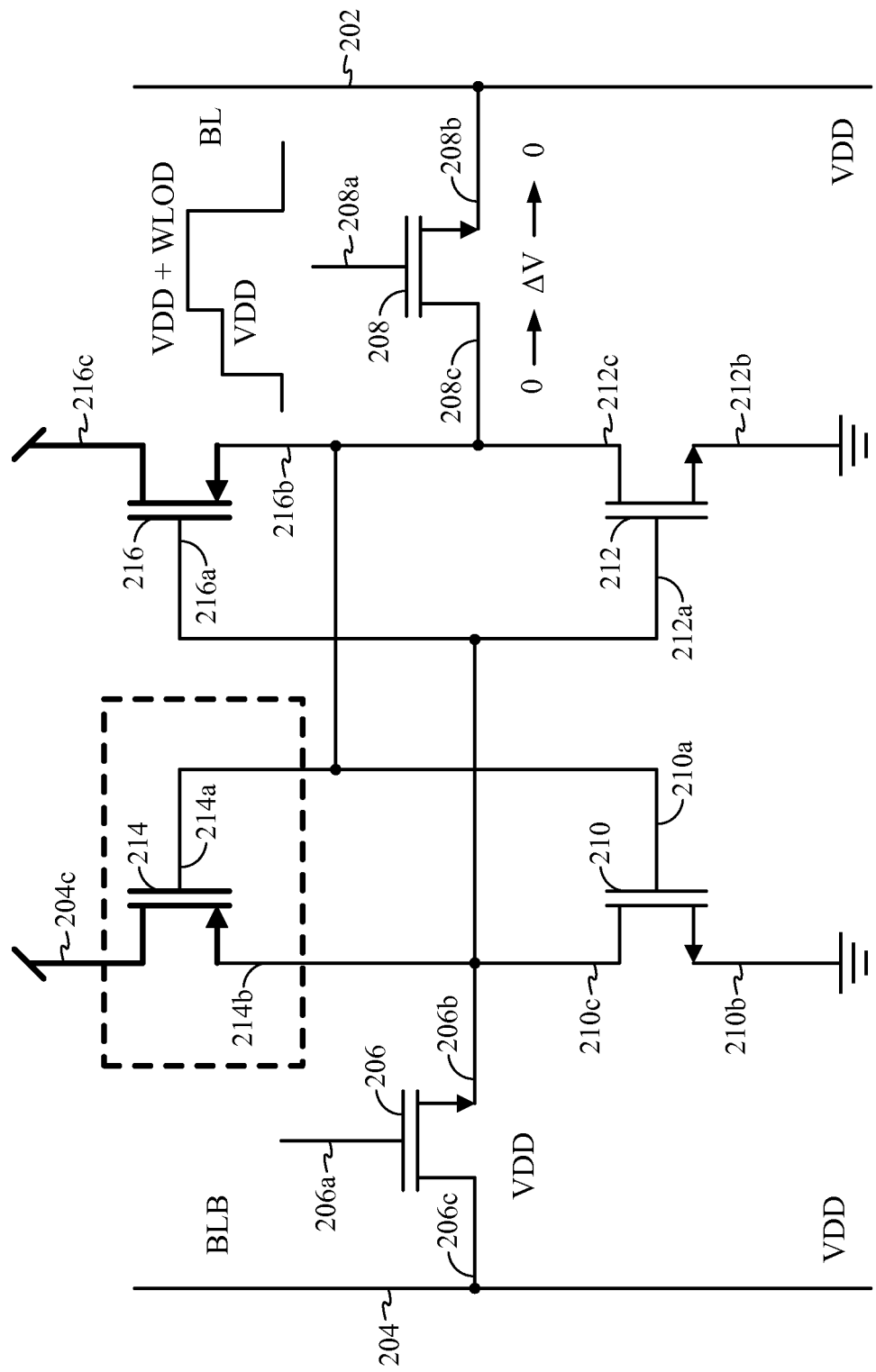
FIG. 2 is a circuit diagram illustrating an example of a six-transistor (6T) SRAM cell to which the aging sensor and aging monitoring according to embodiments of the disclosure are applicable.

FIG. 2 is a circuit diagram illustrating an example of an SRAM cell comprising six transistors, including two p-channel metal oxide semiconductor (PMOS) transistors and four n-channel metal oxide semiconductor (NMOS) transistors. The SRAM cell as shown in FIG. 2 may be an SRAM cell in the aging sensor 106 or in one of the arrays 104a, 104b, 104c, . . . 104h of active SRAM cells as shown in FIG. 1. Although FIG. 2 illustrates a six-transistor (6T) SRAM cell, the apparatus and methods according to various embodiments of the disclosure may be applicable to other types of SRAM cells that include at least one PMOS transistor. In FIG. 2, the power supply voltage $V_{DD}$ is supplied to a bitline (BL) 202 and a bitline bar (BLB) 204. As shown in FIG. 2, the SRAM cell includes a first NMOS transistor 206 having a gate 206a, a source 206b and a drain 206c, and a second NMOS transistor 208 having a gate 208a, a source 208b and a drain 208c. The drain 206c of the first NMOS transistor 206 is connected to the BLB 204 while the source 208b of the second NMOS transistor 208 is connected to the BL 202.

In the embodiment shown in FIG. 2, the 6T SRAM cell also includes a third NMOS transistor 210 having a gate 210a, a source 210b and a drain 210c, a fourth NMOS transistor 212 having a gate 212a, a source 212b and a drain 212c, a first PMOS transistor 214 having a gate 214a, a source 214b and a drain 214c, and a second PMOS transistor 216 having a gate 216a, a source 216b and a drain 216c. As shown in FIG. 2, the source 206b of the first NMOS transistor 206 is connected to the source 214b of the first PMOS transistor 214, the drain 210c of the third NMOS transistor 210, and the gates 216a and 212a of the second PMOS transistor 216 and the fourth NMOS transistor 212, respectively. The drain 208c of the second NMOS transistor 208 is connected to the source 216b of the second PMOS transistor 216, the drain 212c of the fourth NMOS transistor 212, and the gates 214a and 210a of the first PMOS transistor 214 and the third NMOS transistor 210, respectively.

In an embodiment, the first PMOS transistor 214 is stress tested for aging degradation, although a different PMOS transistor in a different type of SRAM cell may be tested within the scope of the disclosure. In the embodiment illustrated in FIG. 2, read operations may be performed for testing aging degradation of the PMOS transistor 214, which initially holds a value of 1, for example. However, when the PMOS transistor 214 is in a stressed or degraded state, its holding of the value 1 would be weakened. In a typical read operation, the voltage across the NMOS transistor 208, which acts as a pass gate, bounces up, which weakens the holding of the value 1 by the degraded PMOS transistor 214. If the PMOS transistor 214 is heavily degraded, then a read operation may cause a read disturbance on the PMOS transistor 214 and result in a loss of read $V_{DDMIN}$ due to NBTI of the PMOS transistor 214. In an embodiment, read operations may be performed on one or more SRAM cells of the aging sensor, including one or more read operations by applying only $V_{DD}$ to the pass gate, that is, the NMOS transistor 208, and one or more read operations by applying an increased voltage of $V_{DD}$+$V_{WLOD}$ that would expect to result in an even weaker holding of the value 1 by the degraded PMOS transistor 214. An embodiment of age sensor testing that includes multiple read operations with $V_{DD}$ only and with $V_{DD}$+$V_{WLOD}$ will be described in further detail with respect to FIG. 5, and embodiments of processes for obtaining parameters to be used for age sensor testing, including $V_{DDMIN}$ and $V_{WLOD}$, will be described in further detail with respect to FIGS. 3 and 4.

In an embodiment, an SRAM read-operation-based aging sensor that has an SRAM cell structure identical to that of an SRAM cell in an active SRAM array for storing or retaining data may be easily integrated on a chip because no special circuit needs to be designed or customized for the aging sensor. The minimum power supply voltage $V_{DDMIN}$, which is the lowest supply voltage that allows read and write operations to be performed reliably on the SRAM cells at a given time, may be an inherently statistical parameter that depends on the density of the SRAM cache on the chip. In a typical scenario, an aging sensor or monitor needs to guard-band the active SRAM arrays at all times. In other words, the aging sensor or monitor needs to have a $V_{DDMIN}$ higher, that is, worse than the active SRAM arrays for storing or retaining data throughout the life of the chip. In an embodiment, a wordline overdrive voltage $V_{WLOD}$ is used to artificially tune the $V_{DDMIN}$ of the aging sensor at the beginning of the life of the device such that $V_{DDMIN}$ of the aging sensor is slightly greater than that of the active SRAM arrays. As both the active SRAM array and the SRAM cells in the aging sensor age with time, one or more failures in read operations in the aging sensor may be used to estimate degradation due to aging in the active SRAM arrays.

Figure 3:
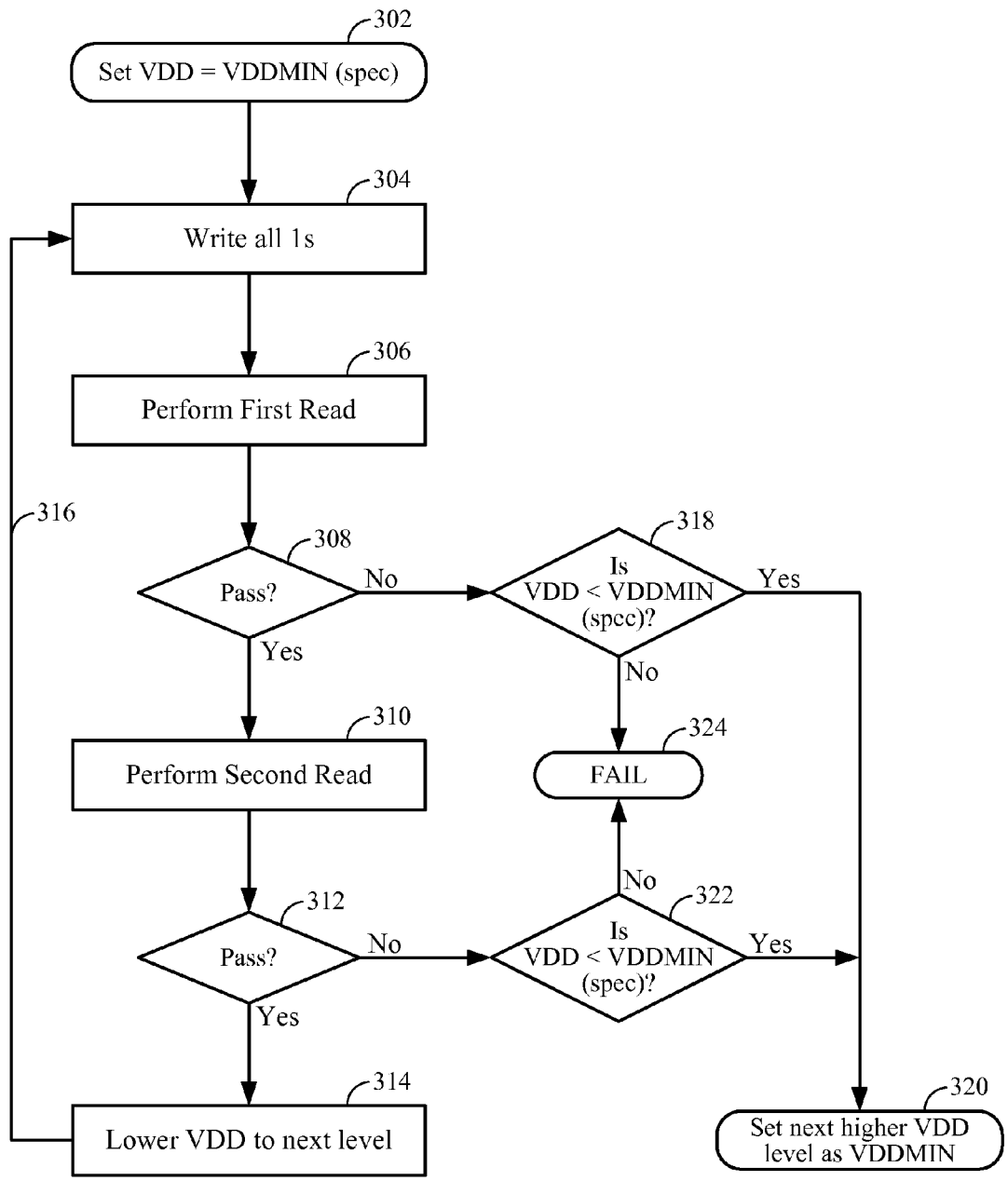
FIG. 3 is a flowchart illustrating an embodiment of a process for searching for a minimum power supply voltage $V_{DDMIN}$ in active SRAM arrays comprising SRAM cells for storing or retaining data.

Before a read testing operation is performed on the aging sensor, a search for the minimum power supply voltage $V_{DDMIN}$ may be performed on the active SRAM arrays in the SRAM cache. An embodiment of a process for searching for $V_{DDMIN}$ in the active SRAM arrays is illustrated in the flowchart of FIG. 3. As illustrated in FIG. 3, the minimum power supply voltage $V_{DD}$ is initially set to equal a specified $V_{DDMIN(SPEC)}$ according to the specification of the device in block 302. For example, for a typical SRAM cache in a processor or SoC device with a typical 20 nm process node, the $V_{DDMIN(SPEC)}$ may be on the order of approximately 850 mV. A writing operation may be performed on all of the SRAM cells in the active SRAM arrays. For example, all of the SRAM cells may be written with 1's as illustrated in block 304. After all of the active SRAM cells are written with 1's in block 304, a first read test is performed on the SRAM cells in block 306. A determination is then made as to whether the active SRAM cells have passed the first read test in block 308 by detecting whether any of the written 1's have changed to 0's.

If the active SRAM cells have passed the first read test in block 308, a second read test may be performed on the active SRAM cells in block 310. In an embodiment, the second read test in block 310 may be the same test as the first read test performed on the active SRAM cells in block 306. One or more additional read tests may also be performed on the active SRAM cells to obtain more reliable read test results. In the embodiment illustrated in FIG. 3, a determination is made as to whether the active SRAM cells have passed the second read test in block 312. If the active SRAM cells have passed the second read test in block 312, the $V_{DD}$, which was initially set at $V_{DDMIN(SPEC)}$ as provided in the product specification, is lowered to a next lower voltage level by a voltage step $\Delta V$ in block 314. In a typical 20 nm process node where the specified minimum power supply voltage $V_{DDMIN(SPEC)}$ is on the order of approximately 850 mV, the voltage step $\Delta V$ for decrementing $V_{DD}$ in each iteration may be on the order of 20 mV, for example.

In the embodiment illustrated in FIG. 3, as long as the active SRAM cells pass the first and second read operations in blocks 308 and 312, $V_{DD}$ may be lowered by $\Delta V$ repeatedly in one or more iterations as indicated by arrow 316 until the active SRAM cells fail to pass either the first read test or the second read test. As shown in FIG. 3, if the active SRAM cells fail to pass the first read test in block 308, a determination is made as to whether $V_{DD}$ is less than $V_{DDMIN(SPEC)}$ in block 318. If $V_{DD}$ is less than $V_{DDMIN(SPEC)}$, then the next higher $V_{DD}$ level is set as the $V_{DDMIN}$ in block 320. In an embodiment, the $V_{DDMIN}$ is set to equal to the next high $V_{DD}$ level that is the current $V_{DD}$ incremented by the voltage step $\Delta V$. In a similar manner, if the active SRAM cells have passed the first read test but failed the second read test in block 312, then a determination is made as to whether $V_{DD}$ is less than $V_{DDMIN(SPEC)}$ in block 322. If $V_{DD}$ is less than $V_{DDMIN(SPEC)}$, then the next higher $V_{DD}$ level is set as the $V_{DDMIN}$ in block 320. In an embodiment, the next higher $V_{DD}$ level is the current $V_{DD}$ incremented by the voltage step $\Delta V$. On the other hand, if it is determined that $V_{DD}$ is greater than or equal to $V_{DDMIN(SPEC)}$ in either block 318 or block 322, then an indication that the search for $V_{DDMIN}$ for the active SRAM cells has failed may be generated in block 324.

Figure 4:
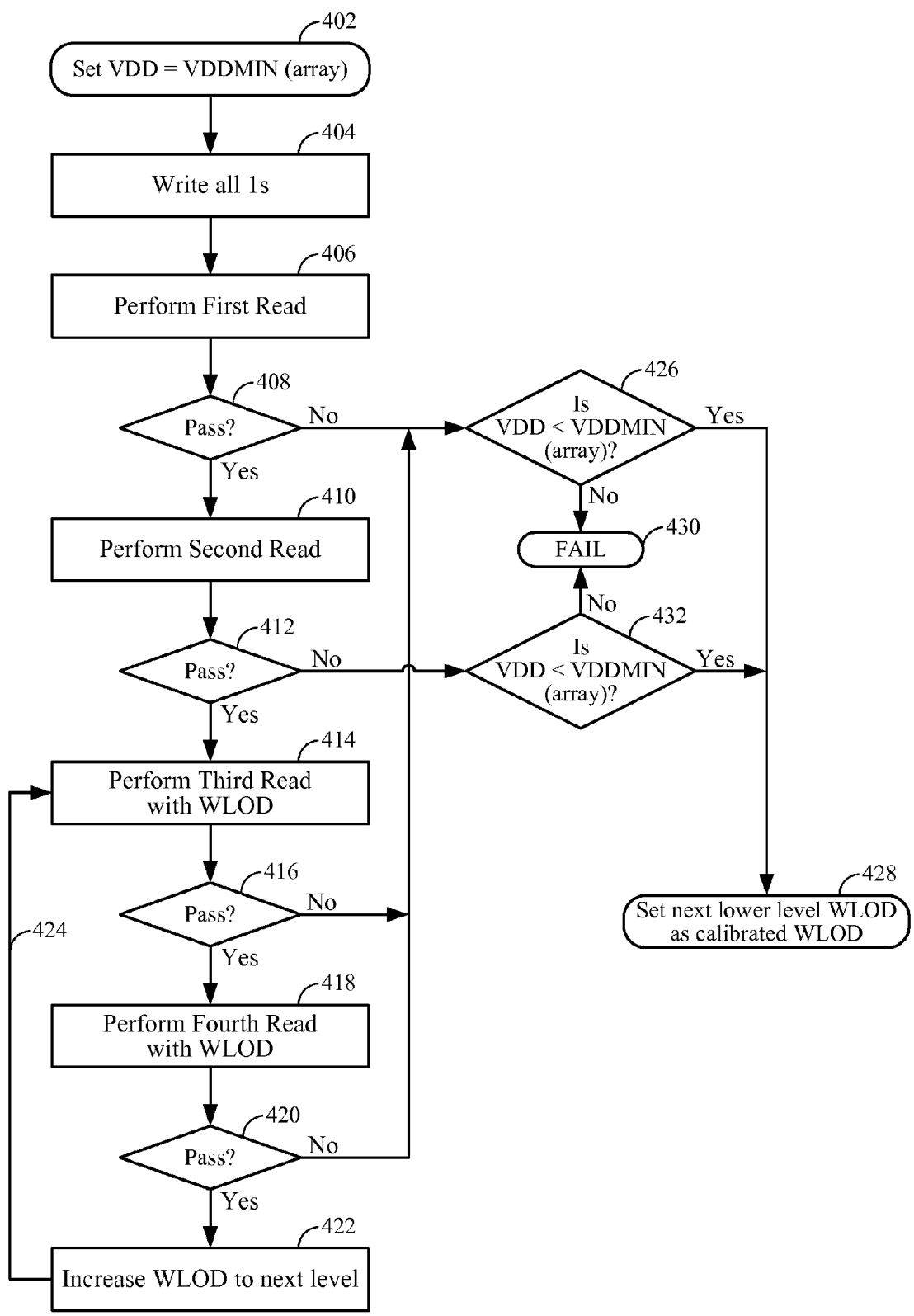
FIG. 4 is a flowchart illustrating an embodiment of a process for aging sensor calibration to determine a calibrated wordline overdrive voltage $V_{WLOD}$.

FIG. 4 is a flowchart illustrating an embodiment of a process for aging sensor calibration to determine a calibrated wordline overdrive voltage $V_{WLOD}$. As illustrated in FIG. 4, the minimum power supply voltage $V_{DD}$ for the SRAM cells in the aging sensor may be initially set to equal to the minimum power supply voltage $V_{DDMIN(ARRAY)}$ for the active SRAM cells in block 402. In an embodiment, the $V_{DDMIN(ARRAY)}$ in block 402 is the same voltage as the $V_{DDMIN}$ for the active SRAM cells generated by block 320 in FIG. 3. Referring to FIG. 4, all of the SRAM cells in the aging sensor may be written with 1's in block 404. In an embodiment, a first read test is performed on the SRAM cells in the aging sensor in block 406. In an embodiment, the first read test in block 406 is performed with only $V_{DD}$, that is, without the addition of $V_{WLOD}$. A determination is then made as to whether the SRAM cells in the aging sensor have passed the first read test in block 408. In an embodiment, if the SRAM cells in the aging sensor have passed the first read test with only $V_{DD}$, then a second read test is again performed on the SRAM cells in the aging sensor with only $V_{DD}$ in block 410. Then a second determination is made as to whether the SRAM cells in the aging sensor have passed the second read test with only VDD in block 412. In another embodiment, one or more additional read tests may be performed on the SRAM cells in the aging sensor with only $V_{DD}$ to produce more reliable read test results. In an embodiment, read tests such as the first read test as shown in block 406 and the second read test as shown in block 410 may be performed as part of BIST operations.

If the SRAM cells in the aging sensor have passed the second read test in block 412, then a third read test may be performed on the SRAM cells in the aging sensor as shown in block 414. In an embodiment, the third read test in block 414 is performed with a voltage that is equal to $V_{DD}+V_{WLOD}$, where $V_{WLOD}$ is a wordline overdrive voltage. At this stage, the wordline overdrive voltage has not yet been calibrated or otherwise precisely determined. In an embodiment, the initial $V_{WLOD}$ may be set to equal to a specified voltage, for example, a voltage on the order of approximately 50 mV for a typical 20 nm process node. A determination is then made as to whether the SRAM cells in the aging sensor have passed the third read test with $V_{DD}+V_{WLOD}$ in block 416. If the SRAM cells in the aging sensor have passed the third read test, then a fourth read test with $V_{DD}+V_{WLOD}$ may be performed on the SRAM cells in the aging sensor as shown in block 418. In another embodiment, one or more additional read tests with $V_{DD}+V_{WLOD}$ may be performed on the SRAM cells in the aging sensor to produce more reliable read test results.

In the embodiment shown in FIG. 4, a determination is made as to whether the SRAM cells in the aging sensor have passed the fourth read test with $V_{DD}+V_{WLOD}$ in block 420. If the SRAM cells in the aging sensor have passed the fourth read test, then the wordline overdrive voltage $V_{WLOD}$ may be increase to the next level in block 422. In an embodiment, $V_{WLOD}$ may be incremented by a voltage step $\Delta V$. After $V_{WLOD}$ has been increased in step 422, additional read tests with $V_{DD}+V_{WLOD}$ may be performed in one or more iterations as indicated by arrow 424 until the SRAM cells in the aging sensor fail one of the read tests with $V_{DD}+V_{WLOD}$ in either block 416 or block 420, for example.

Referring to FIG. 4, if the SRAM cells in the aging sensor fail the first read test with only $V_{DD}$ in block 408, a determination is then made as to whether the power supply voltage $V_{DD}$ for the SRAM cells in the aging sensor is less than the minimum power supply voltage $V_{DDMIN(ARRAY)}$ for the active SRAM cells in the SRAM cache in block 426. If the $V_{DD}$ for the SRAM cells in the aging sensor is less than $V_{DDMIN(ARRAY)}$, then the next lower level of $V_{WLOD}$ is set as the calibrated $V_{WLOD}$ block 428. In an embodiment, the next lower level of $V_{WLOD}$ is set to equal to the current level of $V_{WLOD}$ decremented by the voltage step $\Delta V$. If, on the other hand, the $V_{DD}$ for the SRAM cells in the aging sensor is greater than or equal to $V_{DDMIN(ARRAY)}$, then the aging sensor may output an indication that calibration of $V_{WLOD}$ for the aging sensor has failed in block 430.

In a similar manner, if the SRAM cells in the aging sensor have passed the first read test in block 408 but failed the second read test in block 412 with $V_{DD}$ only, a determination is then made as to whether the $V_{DD}$ for the SRAM cells in the aging sensor is less than $V_{DDMIN(ARRAY)}$ in block 432. If the $V_{DD}$ for the SRAM cells in the aging sensor is less than $V_{DDMIN(ARRAY)}$, then the next lower level of $V_{WLOD}$ is set as the calibrated $V_{WLOD}$ in block 428. Again, the next lower level of $V_{WLOD}$ may be set to equal to the current level of $V_{WLOD}$ decremented by the voltage step $\Delta V$. If, on the other hand, the $V_{DD}$ for the SRAM cells in the aging sensor is greater than or equal to $V_{DDMIN(ARRAY)}$ based on the determination in block 432, then the aging sensor may output an indication that calibration of $V_{WLOD}$ for the aging sensor has failed in block 430.

If the SRAM cells in the aging sensor have passed the first and second read tests in blocks 408 and 412 with $V_{DD}$ only but failed the third read test with $V_{DD}+V_{WLOD}$ in block 416, a determination may be made as to whether the power supply voltage $V_{DD}$ for the SRAM cells in the aging sensor is less than the minimum power supply voltage $V_{DDMIN(ARRAY)}$ for the active SRAM cells in the SRAM cache in block 426. If the $V_{DD}$ for the SRAM cells in the aging sensor is less than $V_{DDMIN(ARRAY)}$, then the next lower level of $V_{WLOD}$ is set as the calibrated $V_{WLOD}$ in block 428. For example, the next lower level of $V_{WLOD}$ may be set to equal to the current level of $V_{WLOD}$ decremented by the voltage step $\Delta V$. If the $V_{DD}$ for the SRAM cells in the aging sensor is greater than or equal to $V_{DDMIN(ARRAY)}$, then the aging sensor may output an indication that calibration of $V_{WLOD}$ for the aging sensor has failed in block 430.

In a similar manner, if the SRAM cells in the aging sensor have passed the first, second and third read tests in blocks 408, 412 and 416 but failed the fourth read test with $V_{DD}+V_{WLOD}$ in block 420, a determination may also be made as to whether the power supply voltage $V_{DD}$ for the SRAM cells in the aging sensor is less than the minimum power supply voltage $V_{DDMIN(ARRAY)}$ for the active SRAM cells in the SRAM cache in block 426. If the $V_{DD}$ for the SRAM cells in the aging sensor is less than $V_{DDMIN(ARRAY)}$, then the next lower level of $V_{WLOD}$ is set as the calibrated $V_{WLOD}$ in block 428. The next lower level of $V_{WLOD}$ may be set to equal to the current level of $V_{WLOD}$ decremented by the voltage step $\Delta V$. Again, if the $V_{DD}$ for the SRAM cells in the aging sensor is greater than or equal to $V_{DDMIN(ARRAY)}$, then the aging sensor may output an indication that calibration of $V_{WLOD}$ for the aging sensor has failed in block 430.

Figure 5:
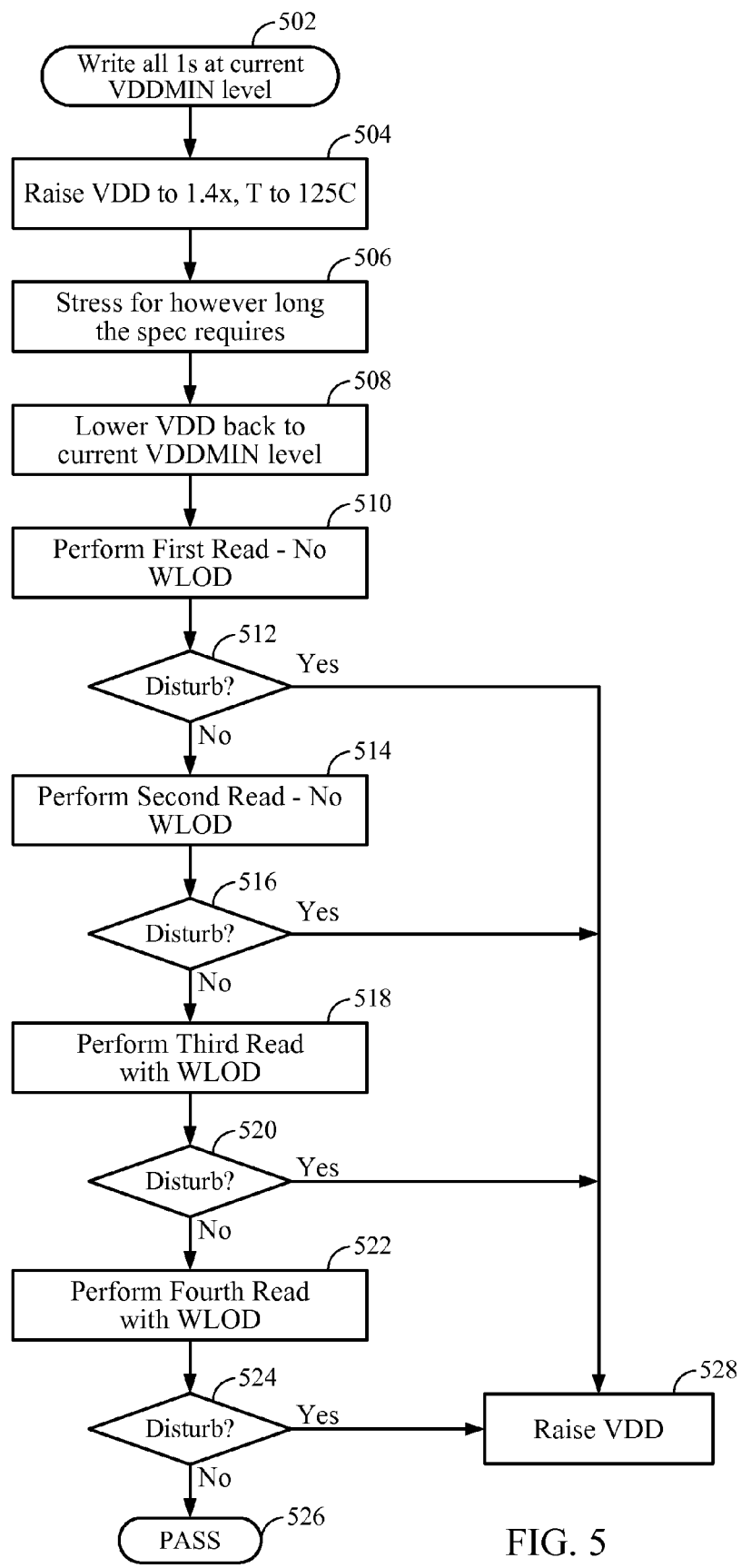
FIG. 5 is a flowchart illustrating an embodiment of a process for testing the aging sensor to set a target power supply voltage $V_{DD}$ for the active SRAM cells based on $V_{DDMIN}$ and $V_{WLOD}$.

FIG. 5 is a flowchart illustrating an embodiment of a process for testing the aging sensor to set a target power supply voltage $V_{DD}$ for the active SRAM cells based on $V_{DDMIN}$ and $V_{WLOD}$. In the embodiment shown in FIG. 5, all of the SRAM cells in the aging sensor are initially written with 1's at the current $V_{DDMIN}$ level in block 502. In an embodiment, the current $V_{DDMIN}$ for the SRAM cells in the aging sensor may be set to equal to the $V_{DDMIN}$ determined by an embodiment of a process for $V_{DDMIN}$ search in the active SRAM cells as shown in FIG. 3. Referring to FIG. 5, the SRAM cells in the aging sensor may be written with all 1's in block 502 at an ambient temperature or normal operating temperature, for example, of approximately 25° C. In an embodiment, the power supply voltage $V_{DD}$ for the SRAM cells in the aging sensor is then raised to a multiple of the initial $V_{DD}$, for example, approximately 1.4 times the initial $V_{DD}$ for a 20 nm process node, and the temperature is raised to a higher temperature, for example, of approximately 125° C., in block 504. The SRAM cells in the aging sensor, and more particularly, the PMOS transistors subjected to stress testing in the aging sensor, are stressed at the higher $V_{DD}$ and higher temperature for a specified time duration, for example, for a time duration required by the product specification, in block 506. After the aging sensor has been stress tested at the higher $V_{DD}$ and higher temperature for the specified time duration, the power supply voltage $V_{DD}$ is lowered to the current $V_{DDMIN}$ level in block 508. In an embodiment, the $V_{DD}$ may be lowered to the same initial $V_{DDMIN}$ level as in block 502.

After the $V_{DD}$ is decreased back to the $V_{DDMIN}$ level in block 508, a first read test with $V_{DD}$ only, that is, without added $V_{WLOD}$, is performed on the SRAM cells in the aging sensor in block 510. A determination is made as to whether a disturbance occurs in block 512. If a disturbance does not occur, then a second read test with $V_{DD}$ only is performed on the SRAM cells in the aging sensor in block 514. A determination is then made as to whether a disturbance occurs as a result of the second read test with $V_{DD}$ only in block 516. One or more additional read tests may be performed with $V_{DD}$ only on the SRAM cells in the aging sensor similar to the read tests as shown in blocks 510 and 514 to produce more reliable test results. In an embodiment, read tests such as the first and second read tests as shown in blocks 510 and 514 may be performed as part of BIST operations.

If a disturbance still does not occur as a result of the second read test with $V_{DD}$ only in block 516, then a third read test is performed on the SRAM cells in the aging sensor with $V_{DD}+V_{WLOD}$ in block 518. A determination is made as to whether a disturbance occurs in block 520 based on the third read test with $V_{DD}+V_{WLOD}$ in block 518. If a disturbance does not occur, then a fourth read test on the SRAM cells in the aging sensor with $V_{DD}+V_{WLOD}$ may be performed in block 522. Again, a determination is made as to whether a disturbance occurs in block 524 based on the fourth read test with $V_{DD}+V_{WLOD}$ in block 522. If a disturbance does not occur in block 524, then the aging sensor may output an indication that the SRAM cells have passed the aging test in block 526. In an alternate embodiment, one or more additional read tests with $V_{DD}+V_{WLOD}$ may be performed on the SRAM cells of the aging sensor to generate a more reliable test result. In an embodiment, read tests with $V_{DD}+V_{WLOD}$ may be performed as part of BIST operations. If, on the other hand, a disturbance is detected upon any of the first, second, third and fourth read tests in any of the blocks 512, 516, 520 and 524 in the embodiment illustrated in FIG. 5, the power supply voltage $V_{DD}$ is raised in block 528. Referring back to FIG. 1, the aging sensor 106 may output an indication to the controller 108 to demand that the power management integrated circuit (PMIC) 110 increase $V_{DD}$ for the SRAM cells in the SRAM cache subsystem 102 on the processor chip or the SoC device.

Figure 6:
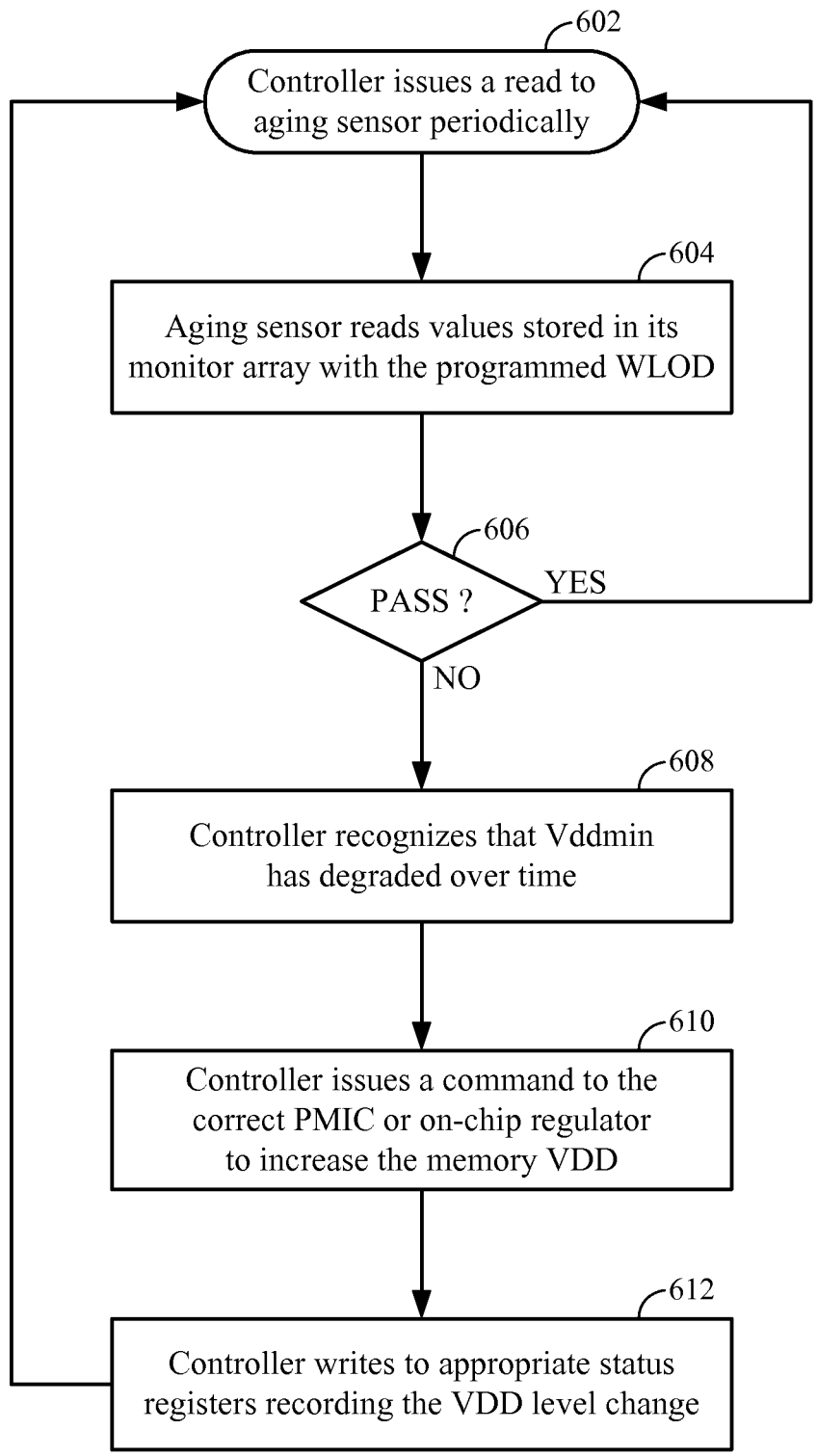
FIG. 6 is a flowchart illustrating an embodiment of a process of a field operation to adjust the power supply voltage $V_{DD}$ for the active SRAM cells based on controller commands and aging sensor monitoring.

FIG. 6 is a flowchart illustrating an embodiment of a process of a field operation to adjust the power supply voltage $V_{DD}$ for the active SRAM cells based on controller commands and aging sensor monitoring. In an embodiment, a controller, such as the controller 108 as shown in FIG. 1 and described above, issues a read command to an aging the aging sensor, such as the aging sensor 106 as shown in FIG. 1 and described above. In the embodiment illustrated in FIG. 6, the controller issues read commands to the aging sensor periodically as shown in block 602. In an embodiment, the controller issues read commands to the aging sensor at fixed time intervals. Alternatively, the controller may issue read commands to the aging sensor at somewhat random time intervals, although it is desirable that at least one read command be issued to the aging sensor without an excessively long lapse of time. Upon receiving the read command from the controller, the aging sensor reds values stored in its own monitor array with a programmed wordline overdrive voltage ($V_{WLOD}$), as shown in block 604.

After the aging sensor reads the values stored in its monitor array in block 604, a test is performed to determine whether the values read from the monitor array of the aging sensor are correct in block 606. If the values read from the monitor array of the aging sensor passes the test in block 606, then no adjustment is made to the power supply voltage ($V_{DD}$), and the controller will issue another read command after a period of time for aging sensor testing as shown in FIG. 6. On the other hand, if the values read from the monitor array of the aging sensor fail the test in block 606, the controller will recognize that the minimum power supply voltage ($V_{DDMIN}$) has degraded over time, as shown in block 608. In response to the recognition that $V_{DDMIN}$ has degraded over time, the controller issues a command to a voltage supply circuit, for example, a power management integrated circuit (PMIC), such as the PMIC 110 as shown in FIG. 1 and described above, or alternatively, an on-chip voltage regulator, to increase $V_{DD}$ for the memory arrays, as shown in block 610 of FIG. 6. In an embodiment, after $V_{DD}$ is increased, the controller writes to appropriate status registers to record the change in $V_{DD}$, as shown in block 612. After the change in $V_{DD}$ is recorded, the controller may issue a subsequent read command to the aging sensor after a period of time, as shown in FIG. 6.

According to embodiments of the disclosure, the actual degradation of SRAM data retention may be measured by an aging sensor. Moreover, the minimum power supply voltage $V_{DDMIN}$ may be dynamically scaled up as the SRAM cache ages to keep ahead of the degradation curve, thereby achieving potential savings in power consumption while requiring a relatively low overhead and a relatively small circuit area for the aging sensor.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A static random access memory (SRAM), comprising:
a plurality of arrays of active SRAM cells to store data; and
an aging sensor comprising an array of sensor SRAM cells configured to dynamically monitor aging of the arrays of active SRAM cells by using an adjustable wordline overdrive voltage ($V_{WLOD}$) in the array of sensor SRAM cells, the array of sensor SRAM cells having a minimum power supply voltage ($V_{DDMIN}$) that is greater than or equal to a $V_{DDMIN}$ for the arrays of active SRAM cells.

2. The SRAM of claim 1, further comprising a controller coupled to the aging sensor to set a power supply voltage ($V_{DD}$) for the arrays of active SRAM cells based on one or more outputs of one or more reading operations of the aging sensor with the adjustable $VW_{LOD}$.

3. The SRAM of claim 2, further comprising a power management integrated circuit (PMIC) coupled to the controller to generate the $V_{DD}$ for the arrays of active SRAM cells.

4. The SRAM of claim 1, wherein the arrays of active SRAM cells are configured to search for the $V_{DDMIN}$ for the active SRAM cells by performing one or more read operations on the arrays of active SRAM cells in one or more built-in self-test (BIST) operations.

5. The SRAM of claim 1, wherein the aging sensor is configured to calibrate the adjustable $V_{WLOD}$ by performing one or more read operations on the array of SRAM cells in the aging sensor using only the $V_{DD}$ and performing one or more read operations on the array of SRAM cells in the aging sensor using the $V_{DD}$ plus the $V_{WLOD}$.

6. The SRAM of claim 1, wherein the aging sensor is configured to set the $V_{DD}$ by stressing at an increased $V_{DD}$ and an increased temperature, lowering the $V_{DD}$ to the $V_{DDMIN}$, performing one or more read operations on the array of SRAM cells in the aging sensor using only the $V_{DD}$, and performing one or more read operations on the array of SRAM cells in the aging sensor using the $V_{DD}$ plus the $V_{WLOD}$.

7. The SRAM of claim 1, wherein the arrays of active SRAM cells each comprise a six-transistor (6T) SRAM cell.

8. The SRAM of claim 7, wherein the 6T SRAM cell comprises at least one p-channel metal oxide semiconductor (PMOS) transistor.

9. A method of searching for a minimum power supply voltage ($V_{DDMIN}$) for a static random access memory (SRAM) comprising a plurality of SRAM cells, each of the SRAM cells comprising a plurality of metal oxide semiconductor (MOS) transistors including at least one p-channel MOS (PMOS) transistor, the method comprising:
(a) setting an initial power supply voltage ($V_{DD}$) to a specified minimum power supply voltage ($V_{DDMIN(SPEC)}$);
(b) writing ones to all of the SRAM cells;
(c) performing a first read test of the SRAM cells;
(d) determining whether the first read test passes;
(e) if the first read test passes, performing at least one additional read test of the SRAM cells; and
(f) if said at least one additional read test passes, decreasing $V_{DD}$ by a predetermined amount ($\Delta V$).

10. The method of claim 9, further comprising:
repeating steps (b)-(e) until the first read test fails;
if the first read test fails, determining whether $V_{DD}$ is less than $V_{DDMIN(SPEC)}$; and
if $V_{DD}$ is less than $V_{DDMIN(SPEC)}$, setting $V_{DD}$ plus $\Delta V$ as the $V_{DDMIN}$.

11. The method of claim 10, further comprising:
if $V_{DD}$ is greater than $V_{DDMIN(SPEC)}$, outputting an indication that searching for $V_{DDMIN}$ fails.

12. The method of claim 10, further comprising:
repeating steps (b)-(e) until said at least one additional read test fails;
if said at least one additional read test fails, determining whether $V_{DD}$ is less than $V_{DDMIN(SPEC)}$; and
if $V_{DD}$ is less than $V_{DDMIN(SPEC)}$, setting $V_{DD}$ plus $\Delta V$ as the $V_{DDMIN}$.

13. The method of claim 12, further comprising:
if $V_{DD}$ is greater than $V_{DDMIN(SPEC)}$, outputting an indication that searching for $V_{DDMIN}$ fails.

14. The method of claim 9, wherein the first read test of the SRAM cells is performed in a built-in self-test (BIST) operation.

15. The method of claim 9, wherein said at least one additional read test of the SRAM cells is performed in a built-in self-test (BIST) operation.

16. A method of calibrating an aging sensor in a static random access memory (SRAM) comprising a plurality of active SRAM cells, each of the SRAM cells comprising a plurality of metal oxide semiconductor (MOS) transistors including at least one p-channel MOS (PMOS) transistor, the method comprising:
(a) setting an initial power supply voltage ($V_{DD}$) for the aging sensor to a minimum power supply voltage $V_{DDMIN(ARRAY)}$ for the active SRAM cells;
(b) writing ones to all of the SRAM cells in the aging sensor;
(c) performing a first read test of the SRAM cells in the aging sensor with only $V_{DD}$;
(d) determining whether the first read test of the SRAM cells in the aging sensor with only $V_{DD}$ passes;

(e) if the first read test of the SRAM cells in the aging sensor with only $V_{DD}$ passes, performing a second read test of the SRAM cells in the aging sensor with only $V_{DD}$;

(f) if the second read test of the SRAM cells in the aging sensor with only $V_{DD}$ passes, performing a third read test of the SRAM cells in the aging sensor with $V_{DD}$ plus a wordline overdrive voltage ($V_{WLOD}$);

(g) if the third read test of the SRAM cells in the aging sensor with $V_{DD}$ plus $V_{WLOD}$ passes, performing a fourth read test of the SRAM cells in the aging sensor with $V_{DD}$ plus $V_{WLOD}$; and (h) if the fourth read test of the SRAM cells in the aging sensor with $V_{DD}$ plus $V_{WLOD}$ passes, increasing $V_{WLOD}$ by a predetermined amount ($\Delta V$).

17. The method of claim 16, further comprising:
repeating steps (f)-(h) until the third read test of the SRAM cells in the aging sensor with $V_{DD}$ plus $V_{WLOD}$ fails;
if the third read test of the SRAM cells in the aging sensor with $V_{DD}$ plus $V_{WLOD}$ fails, determining whether $V_{DD}$ is less than $V_{DDMIN(ARRAY)}$; and
if $V_{DD}$ is less than $V_{DDMIN(ARRAY)}$, setting $V_{WLOD}$ minus $\Delta V$ as a calibrated $V_{WLOD}$.

18. The method of claim 17, further comprising:
if $V_{DD}$ is greater than $V_{DDMIN(ARRAY)}$, outputting an indication that calibration of the aging sensor fails.

19. The method of claim 16, further comprising:
repeating steps (f)-(h) until the fourth read test of the SRAM cells in the aging sensor with $V_{DD}$ plus $V_{WLOD}$ fails;
if the fourth read test of the SRAM cells in the aging sensor with $V_{DD}$ plus $V_{WLOD}$ fails, determining whether $V_{DD}$ is less than $V_{DDMIN(ARRAY)}$; and
if $V_{DD}$ is less than $V_{DDMIN(ARRAY)}$, setting $V_{WLOD}$ minus $\Delta V$ as a calibrated $V_{WLOD}$.

20. The method of claim 19, further comprising:
if $V_{DD}$ is greater than $V_{DDMIN(ARRAY)}$, outputting an indication that calibration of the aging sensor fails.

21. The method of claim 16, further comprising:
if the first read test of the SRAM cells in the aging sensor with only $V_{DD}$ fails, determining whether $V_{DD}$ is less than $V_{DDMIN(ARRAY)}$; and
if $V_{DD}$ is less than $V_{DDMIN(ARRAY)}$, setting $V_{WLOD}$ minus $\Delta V$ as a calibrated $V_{WLOD}$.

22. The method of claim 21, further comprising:
if $V_{DD}$ is greater than $V_{DDMIN(ARRAY)}$, outputting an indication that calibration of the aging sensor fails.

23. The method of claim 16, further comprising:
if the second read test of the SRAM cells in the aging sensor with only $V_{DD}$ fails, determining whether $V_{DD}$ is less than $V_{DDMIN(ARRAY)}$; and
if $V_{DD}$ is less than $V_{DDMIN(ARRAY)}$, setting $V_{WLOD}$ minus $\Delta V$ as a calibrated $V_{WLOD}$.

24. The method of claim 23, further comprising:
if $V_{DD}$ is greater than $V_{DDMIN(ARRAY)}$, outputting an indication that calibration of the aging sensor fails.

25. The method of claim 16, wherein the first and second read tests of the SRAM cells in the aging sensor with only $V_{DD}$ are performed in built-in self-test (BIST) operations.

26. The method of claim 16, wherein the third and fourth read tests of the SRAM cells in the aging sensor with $V_{DD}$ plus $V_{WLOD}$ are performed in built-in self-test (BIST) operations.

27. A method of operating a static random access memory (SRAM) comprising a plurality of arrays of active SRAM cells to store data and an aging sensor comprising an array of sensor SRAM cells, the method comprising:

(a) issuing a read command to the aging sensor;
(b) reading, by the aging sensor, values stored in the array of sensor SRAM cells with a programmed wordline overdrive voltage ($V_{WLOD}$);
(c) determining whether the values read by the aging sensor are correct; and
(d) if the values read by the aging sensor are incorrect, increasing a power supply voltage ($V_{DD}$) for the arrays of active SRAM cells.

28. The method of claim 27, further comprising:
If the values read by the aging sensor is correct, repeating step (a) after a period of time.

29. The method of claim 27, further comprising recognizing that a minimum power supply voltage ($V_{DDMIN}$) for the arrays of active SRAM cells has degraded over time.

30. The method of claim 27, further comprising recording an increase in $V_{DD}$ for the arrays of active SRAM cells.

* * * * *